(12) United States Patent
Zhou et al.

(10) Patent No.: US 12,550,371 B2
(45) Date of Patent: Feb. 10, 2026

(54) SEPARATE GATE COMPLEMENTARY FIELD-EFFECT TRANSISTOR

(71) Applicant: International Business Machines Corporation, Armonk, NY (US)

(72) Inventors: Huimei Zhou, Albany, NY (US); Ruilong Xie, Niskayuna, NY (US); Miaomiao Wang, Albany, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 858 days.

(21) Appl. No.: 17/554,394

(22) Filed: Dec. 17, 2021

(65) Prior Publication Data

US 2023/0197813 A1 Jun. 22, 2023

(51) Int. Cl.
| | |
|---|---|
| H10D 30/67 | (2025.01) |
| H10D 30/00 | (2025.01) |
| H10D 62/10 | (2025.01) |
| H10D 84/01 | (2025.01) |
| H10D 84/03 | (2025.01) |
| H10D 84/85 | (2025.01) |

(52) U.S. Cl.
CPC ....... *H10D 30/6735* (2025.01); *H10D 30/509* (2025.01); *H10D 30/6757* (2025.01); *H10D 62/118* (2025.01); *H10D 84/0172* (2025.01); *H10D 84/038* (2025.01); *H10D 84/85* (2025.01)

(58) Field of Classification Search
CPC ............. H10D 30/6735; H10D 62/121; H10D 30/501; H10D 30/019; H10D 62/117; H10D 84/0149; H10D 84/0186; H10D 30/507–509; H10D 30/62–6219; H10D 30/67–6759
See application file for complete search history.

(56) References Cited

U.S. PATENT DOCUMENTS

| | | | |
|---|---|---|---|
| 5,920,088 | A | 7/1999 | Augusto |
| 8,273,610 | B2 | 9/2012 | Or-Bach et al. |
| 8,574,982 | B2 | 11/2013 | Erickson et al. |
| 8,642,416 | B2 | 2/2014 | Or-Bach et al. |
| 9,219,005 | B2 | 12/2015 | Or-Bach et al. |

(Continued)

FOREIGN PATENT DOCUMENTS

| | | |
|---|---|---|
| CN | 111668219 A | 9/2020 |
| CN | 112687626 A | 4/2021 |
| WO | 2023109395 A1 | 6/2023 |

OTHER PUBLICATIONS

International Search Report and Written Opinion of PCT/CN2022/131699, Jan. 28, 2023, 8 pages.

(Continued)

*Primary Examiner* — William B Partridge
*Assistant Examiner* — Alexandre X Ramirez
(74) *Attorney, Agent, or Firm* — Samuel Waldbaum; Ryan, Mason & Lewis, LLP

(57) ABSTRACT

A semiconductor structure comprises a first nanosheet device having at least one first channel layer and a first gate, a second nanosheet device disposed above the first nanosheet device and having at least one second channel layer and a second gate, and an isolation layer disposed between the first nanosheet device and the second nanosheet device to electrically isolate the first nanosheet device and the second nanosheet device.

15 Claims, 13 Drawing Sheets

(56) References Cited

U.S. PATENT DOCUMENTS

| | | | |
|---|---|---|---|
| 9,490,323 | B2 | 11/2016 | Rodder et al. |
| 9,842,914 | B1 | 12/2017 | Yeung et al. |
| 9,997,598 | B2 | 6/2018 | Smith et al. |
| 10,008,583 | B1 | 6/2018 | Rodder et al. |
| 10,192,819 | B1 | 1/2019 | Chanemougame et al. |
| 10,192,867 | B1 | 1/2019 | Frougier et al. |
| 10,256,158 | B1 | 4/2019 | Frougier et al. |
| 10,424,639 | B1 | 9/2019 | Miao et al. |
| 11,309,319 | B2 | 4/2022 | Mann et al. |
| 2020/0075574 | A1* | 3/2020 | Smith .................. H10D 84/856 |
| 2020/0235098 | A1* | 7/2020 | Li ....................... H10D 30/6735 |
| 2020/0286900 | A1 | 9/2020 | Mann et al. |
| 2020/0365601 | A1 | 11/2020 | Mann et al. |
| 2021/0104522 | A1 | 4/2021 | Gardner et al. |
| 2021/0265345 | A1 | 8/2021 | Xie et al. |
| 2021/0349691 | A1* | 11/2021 | Hekmatshoartabari ...................... H10D 30/6713 |
| 2022/0122971 | A1* | 4/2022 | Peng ................. H01L 21/02603 |
| 2023/0178554 | A1* | 6/2023 | Chehab .............. H10D 84/0186 257/351 |

OTHER PUBLICATIONS

N. Loubet et al., "Stacked Nanosheet Gate-All-Around Transistor to Enable Scaling Beyond FinFET," Symposium on VLSI Technology, Jun. 5-8, 2017, 3 pages.

J. Ryckaert et al., "The Complementary FET (CFET) for CMOS Scaling Beyond N3," IEEE Symposium on VLSI Technology Digest of Technical Papers, Jun. 18-22, 2018, pp. 141-142.

* cited by examiner

Y-Y

X-X

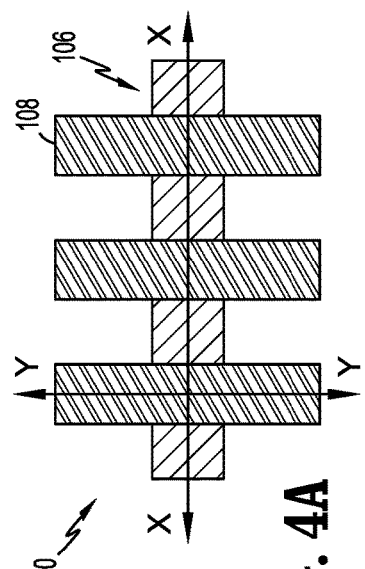
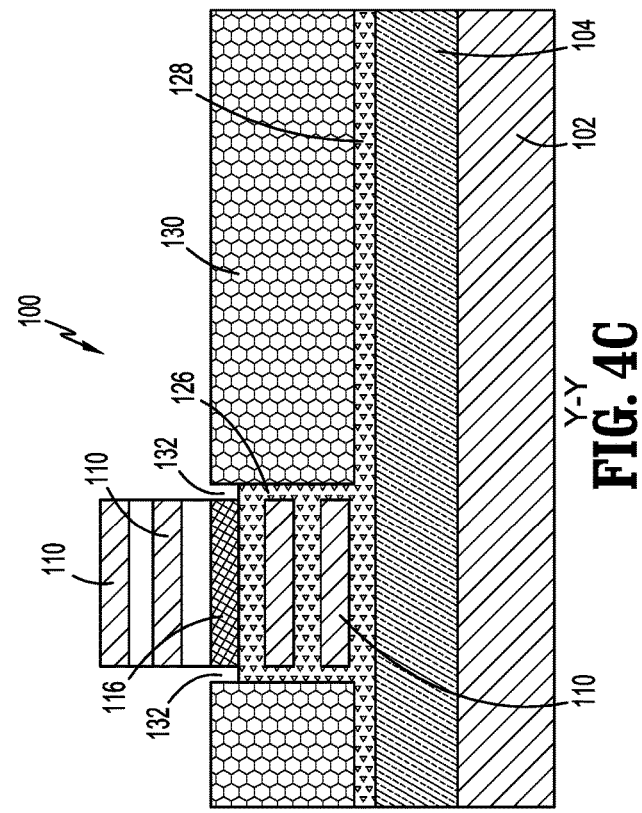
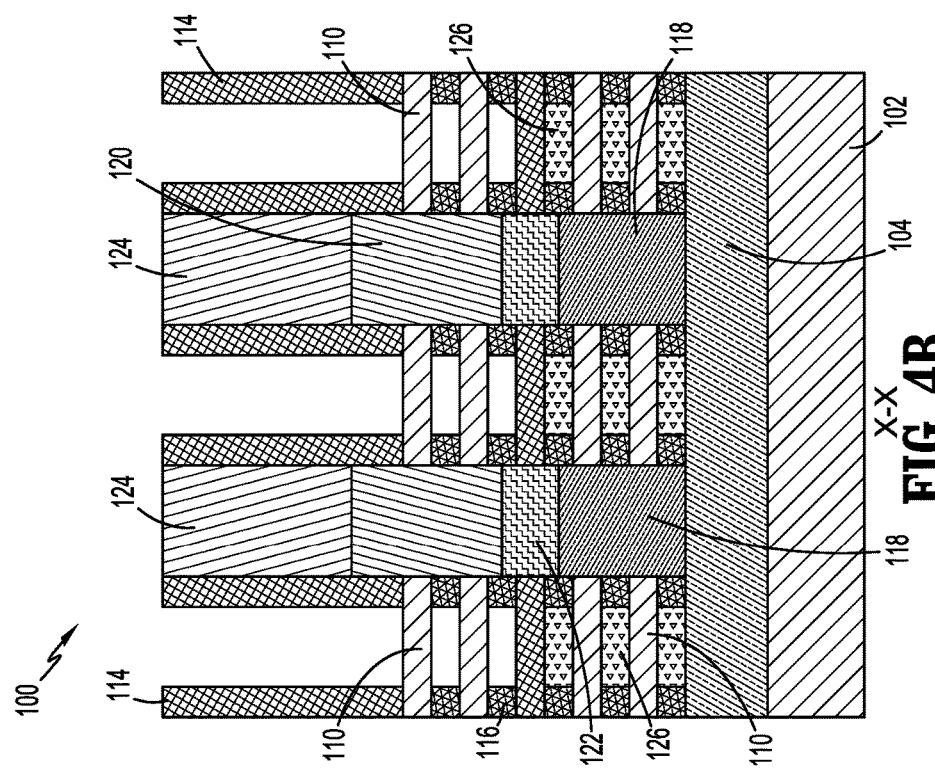
FIG. 4A
FIG. 4B
FIG. 4C

Y-Y

SEPARATE GATE COMPLEMENTARY FIELD-EFFECT TRANSISTOR

BACKGROUND

Continued innovations in semiconductor process technologies are enabling higher integration densities and associated device scaling. As the semiconductor industry moves towards the 5 nanometer (nm) production node and beyond, fin field-effect transistor (FinFET) devices must be scaled to smaller dimensions to provide an increased effective channel width per footprint area. Such scaling in some cases is achieved using nanosheet devices. A given nanosheet FinFET device comprises a channel which includes multiple nanosheet layers arranged in a stacked configuration, with each nanosheet layer having a vertical thickness that is substantially less than its width. A common gate structure is formed in areas wrapping around the nanosheet layers in the stacked configuration, thereby increasing the effective channel width of the resulting device, and thus the drive current supported thereby, for a given footprint area. Nanosheet technologies are considered to be a viable option for continued scaling of metal-oxide-semiconductor (MOS) devices, such as complementary FET (CFET) devices comprising an n-type FET (nFET) region and/or a p-type FET (pFET) region. CFET devices are considered as next generation devices to address the scaling issues described hereinabove.

SUMMARY

In accordance with one illustrative embodiment, a semiconductor structure comprises a first nanosheet device having at least one first channel layer and a first gate, a second nanosheet device disposed above the first nanosheet device and having at least one second channel layer and a second gate, and an isolation layer formed between the first nanosheet device and the second nanosheet device to electrically isolate the first nanosheet device and the second nanosheet device.

In accordance with another illustrative embodiment, an integrated circuit comprises a first FET structure including a first gate having a first gate extension, a second FET structure disposed above the first FET structure and having a second gate, a first gate contact coupled to the first gate extension of the first gate, and a second gate contact coupled to the second gate and isolated from the first gate.

In accordance with another illustrative embodiment, a method comprises forming a first nanosheet device wherein the first nanosheet device includes at least one first channel layer, a first gate at least partially surrounding the at least one channel layer, and a first gate extension extending from the first gate, forming a second nanosheet device above the first nanosheet device where the second nanosheet device includes at least one second channel layer and a second gate, and coupling a first gate contact with the first gate extension.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 4A is a schematic plan view in plan of a semiconductor structure including one or more nanosheet structures and gates to be processed at a fourth intermediate stage of fabrication according to one or more illustrative embodiments.

FIG. 4B is a cross-sectional view of the semiconductor structure taken along the lines x-x of FIG. 4A at the fourth intermediate stage of fabrication illustrating removal of the first work function metal from the upper FET structure according to one or more illustrative embodiments.

FIG. 4C is a cross-sectional view of the semiconductor structure taken along the lines y-y of FIG. 4A at the fourth intermediate stage of fabrication illustrating selective removal of portions of the isolation layer to form gaps around the lower FET structure according to one of more illustrative embodiments.

DETAILED DESCRIPTION

Figure 1A:
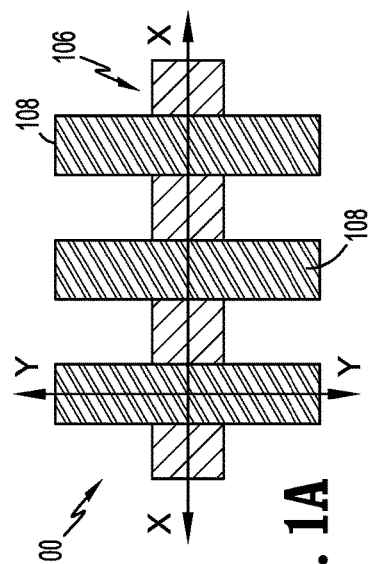
FIG. 1A is a schematic plan view in plan of the semiconductor structure including one or more nanosheet structures and gates to be processed at a first intermediate stage of fabrication according to one or more illustrative embodiments.

It is to be understood in advance that although this description includes a detailed description of an illustrative stacked IC structure containing a complementary FET (CFET) architecture having separate nFET and pFET gate contacts, implementation of the teachings recited herein are not limited to the particular CFET architecture described herein. Rather, embodiments of the present invention are capable of being implemented in conjunction with any other type of FinFET device, including, for example, any FinFET with active regions, including, but not limited to nanosheet FinFET architectures and transistor structures.

As will be described in detail below, the present stacked nanosheet complementary field effect transistor (CFET) device has a true gate-all-around n-channel (nFET) over a true gate-all-around p-channel FET (pFET) or, alternatively, a true gate-all-around pFET over a true gate-all-around nFET. The gate-all-around nFET and pFET gate structures are fully isolated by a dielectric.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure of a device according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate one or more nanosheet CFET structures or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in a different order or sequence. In addition, one or more processes may be incorporated within various intermediate stages as described herein, and one or more processes may be implemented in intermediate stages as otherwise described herein.

Figure 1C:
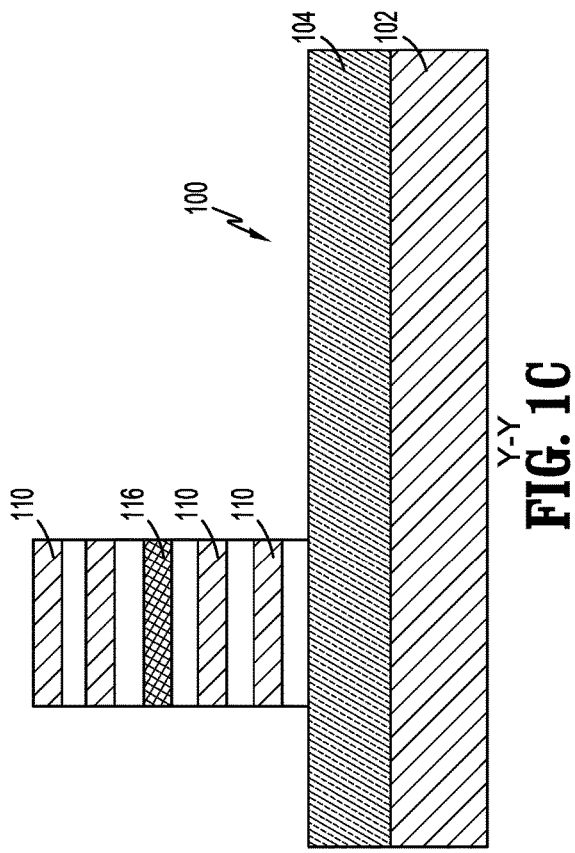
FIG. 1C is a cross-sectional view of the semiconductor structure taken along the lines y-y of FIG. 1A at the first intermediate stage of fabrication according to one or more illustrative embodiments.
Figure 1B:
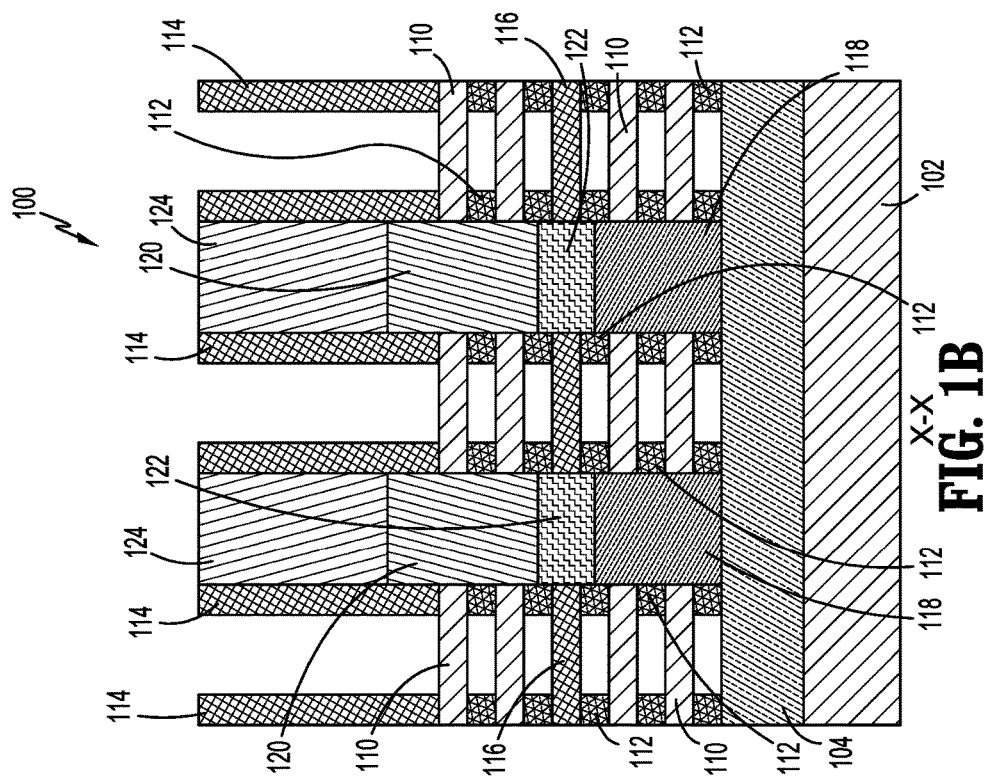
FIG. 1B is a cross-sectional view of the semiconductor structure taken along the lines x-x of FIG. 1A at the first intermediate stage of fabrication, illustrating removal of the sacrificial gates to form a plurality of individual CFET stack structures, lower source and drain (S/D) regions formed on opposite sides of the lower FET structure and upper source and drains (S/D) regions formed on sides of the upper FET structure separated by an isolation later according to one or more illustrative embodiments.

FIG. 1A is a schematic plan view of the semiconductor structure 100 at a first intermediate stage of fabrication. FIG. 1B is a cross-sectional view of the semiconductor structure along lines x-x at the first intermediate stage and FIG. 1C is a cross-sectional view of the semiconductor structure along lines y-y at the first intermediate stage. The semiconductor structure 100 includes a semiconductor substrate 102 defining a first or longitudinal x-x axis and a second or y-y axis orthogonal to the x-x axis. (FIG. 1A). The semiconductor substrate 102 may be in the form of a substrate or wafer comprising a silicon (Si) material or other dielectric material, such as silicon oxide or silicon nitride. While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another illustrative embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of, for example, a front end of line (FEOL) or and middle of line (MOL) device. In illustrative embodiments, the semiconductor substrate 102 may have a thickness of about 500 to 1000 micrometers (μm). The semiconductor substrate 102 may itself comprise multiple layers, although it is shown as a single layer in the figures, again for clarity and simplicity of illustration. In illustrative embodiments, the semiconductor structure 100 includes an insulative oxide layer 104 disposed over the semiconductor substrate 102. The oxide layer 104 can be, for example, a buried oxide layer (typically SiO2) or a bottom dielectric isolation layer formed early in the process (typically SiN, SiBCN, SiOCN, SiOC, or any combination of low-k materials).

As generally depicted in FIG. 1A, the semiconductor substrate 102 includes a complementary nanosheet stack 106 (e.g., active areas or regions) extending along the longitudinal x-axis and a plurality of, for example, three sacrificial gates 108 extending transversely over the nanosheet stack 106 relative to the orthogonal y-axis. The number of nanosheet stacks 106 and sacrificial gates 108 may vary. The nanosheet stack 106 may be continuous or segmented.

As best depicted in FIGS. 1B and 1C, at this first initial stage of fabrication, the nanosheet stack 106 includes a plurality of channel layers 110. The lower channel layers 110 in the nanosheet stack 106 will form a device of a first polarity, i.e., a pFET or an nFET device, and the upper channel layers 110 in the nanosheet stack 106 will form a device of a second/opposite polarity, i.e., an nFET device if the lower device is a pFET device, or vice versa. In one illustrative embodiment, the semiconductor structure 100 includes an upper nFET structure over a lower pFET structure. The sacrificial gates 108 of the CFET device are oriented orthogonal to the channel layers 110. In FIG. 1A, three sacrificial gates 108 are shown. As will be described in detail below, these sacrificial gates 108 are later replaced with metal gates (also referred to herein as "replacement metal gates"). However, the orientation of the gates vis-à-vis the nanosheet stack 106 is the same for the sacrificial and replacement metal gates.

In illustrative embodiments depicted in FIG. 1B, the sacrificial layers of the nanosheet stack 106 and portions of the sacrificial gates 108 (including, for example, the silicon or other dielectric and the overlying hard mask layer) are shown removed. In illustrative embodiments, the removed sacrificial layers comprise silicon-germanium (SiGe) and the channel layers 110 comprise silicon (Si). Other materials for the sacrificial layers and the channel layers 110 and are also contemplated. The channel layers 110 are the nanosheet layers or sheets of a nanosheet channel transistor structure. Although the nanosheet stacks 106 are shown as including four channel layers 110, it should be understood that in other illustrative embodiments any number of channel layers 110 may be used. In addition, any semiconductor material composition may be used for the removed sacrificial layers and the channel layers 110 so long as at least one of the compositions selected allow for selective etching between at least two of them. More specifically, any type IV semiconductor composition combination and/or III-V semiconductor composition combination may be suitable. In addition, the thickness of the channel layers 110 are shown as being substantially equal. However, it is to be appreciated that the thicknesses of the channel layers 110 may vary. In illustrative embodiments, the height or thickness of the channel layers 110 may range from about 4 nanometers (nm) to about 30 nanometers (nm), and more particularly, may range from about 6 nanometers (nm) to about 15 nanometers (nm). The channel layers 110 may comprise silicon (Si) although other materials are contemplated. The channel layers 110 will be the nanosheet layers or sheets of a nanosheet channel transistor structure subsequent to release or removal of the sacrificial layers. The channel layers 110 are supported in spaced relation by inner spacers 112. The inner spacers 112 may be formed by depositing a conformal dielectric layer over the semiconductor structure 100. The dielectric layer fills removed areas of the sacrificial layers to form the inner spacers 112.

The channel layers 110 may be epitaxially grown in an alternating fashion in accordance with conventional methodologies. For example, the alternating series of silicon germanium (SiGe) sacrificial layers and the silicon (Si) channel layers 110 may be formed by epitaxially growing one layer and then the next until the desired number and desired thicknesses of the sacrificial and channel layers 110 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable processes. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor structure.

Referring still to FIGS. 1A-1C, the sacrificial gates 108 are formed on the nanosheet stack 106 via conventional methodologies. As noted hereinabove, in FIGS. 1B and 1C, portions of the original sacrificial gates 108 are shown removed. The sacrificial gates 108 each serve as a placeholder that is subsequently removed and replaced with suitable gate materials to form a functional gate structure. The sacrificial gates 108 may comprise any material that can be etched selectively to the materials of the channel layers 110. One suitable material for the sacrificial gates 108 include, but are not limited to, ploy-silicon (poly-Si) and/or amorphous silicon (a-Si). A process such as CVD, ALD or PVD can be employed to deposit the sacrificial gate material over the nanosheet device stack 106. The sacrificial gates 108 may be patterned by conventional lithographic and etch process to form arrays of gates over the nanosheet stack 106. Prior to the sacrificial material deposition, a thin SiO2 layer can be conformally deposited first to separate the nanosheet stack from the sacrificial gate material. The sacrificial gates 108 may originally comprise a sacrificial gate hardmasks formed on the sacrificial gate 108 marking the footprint and location of each of the sacrificial gates 108. The hardmasks may be formed of any suitable material, e.g., a silicon nitride (SiN), over the sacrificial gates 108. The hardmasks and the sacrificial gates 108 may be further patterned by conventional lithographic and etch process to form arrays of gates over the nanosheet stacks. The hardmasks protects the top surface of the sacrificial gate during formation of the epitaxial source/drain regions.

FIG. 1B further illustrates a gate spacer 114 formed in association with the sacrificial gates 108. The gate spacer 114 may comprise a dielectric material, such as silicon boron carbide nitride (SiBCN), an oxide, nitride, silicon nitride (SiN), silicon oxide SO2 or other materials including low-k materials. In illustrative embodiments, the gate spacer 114 comprises silicon boron carbide nitride (SiBCN). The gate spacer 114 may be formed using a deposition process, such as chemical vapor deposition (CVD) or ALD and a reactive-ion etching (RIE) process. The gate spacer 114 may have a wall thickness ranging from about 3 nanometers (nm) to about 15 nanometers (nm).

The semiconductor structure 100 further includes an isolation spacer layer 116 which electrically disconnects a first source and a first drain of a first (lower) FET structure from a second source and a second drain of a second (upper) FET structure as will be further described hereinbelow. FIGS. 1B and 1C further illustrate the formation of source and drain (S/D) regions 118 within trenches disposed between side walls of adjacent gate spacers 114. The lower S/D regions 118 are formed within the trenches adjacent the lower nFET devices using an epitaxial layer growth process. In illustrative embodiments, the lower S/D regions 118 comprise epitaxial growth of boron doped silicon germanium (SiGe) as a pFET device. Alternatively, the lower S/D regions 118 may include epitaxial growth of phosphorus doped silicon for an nFET device. The epitaxial growth or layers may provide at least a portion of the lower S/D regions 118 of the semiconductor structure 100. As used herein, the term "drain" means a doped region in a semiconductor structure located at the end of the channel region, in which carriers are flowing out of the semiconductor structure 100, e.g., nanosheet transistor structure, through the drain. The term "source" is a doped region in the semiconductor structure, in which a majority of carriers are flowing into the channel region. The lower S/D regions 118 can be formed by in-situ doping (doping during epitaxy) or ex-situ doping, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the lower S/D regions 118 may be carried out in a chemical vapor deposition apparatus, such as a metal organic chemical vapor deposition (MOCVD) apparatus or a plasma enhanced chemical vapor deposition (PECVD) apparatus. The S/D regions 118 may be in situ doped to a p-type or n-type conductivity. The term "in situ" denotes that a dopant, e.g., p-type or n-type dopant, is introduced to the base semiconductor material, e.g., silicon or silicon germanium, during the formation of the base material. In one illustrative embodiment, for a p-type conductivity, boron p-type dopants are introduced into the epitaxial growth of silicon germanium and, for an n-type conductivity, phosphorous n-type dopants are introduced into the epitaxial growth of silicon. Thereafter, upper source and drain (S/D) regions 120 are formed above the lower S/D regions 118. The upper S/D regions 120 may be formed in accordance with any of the procedures and methodologies described hereinabove. In illustrative embodiments, a layer of dielectric material 122 may separate the lower and upper S/D regions 118, 120.

FIG. 1B further illustrates an interlayer dielectric (ILD) layer 124 disposed above the upper S/D regions 120. Suitable ILD materials include, but are not limited to, oxide low-k materials such as silicon oxide (SiOx) and/or oxide ultralow-k interlayer dielectric (ULK-ILD) materials, e.g., having a dielectric constant κ of less than 2.7. By comparison, silicon dioxide (SiO2) has a dielectric constant κ value of 3.9. Suitable ultralow-κ dielectric materials include, but are not limited to, porous organosilicate glass (pSiCOH).

Figure 2A:
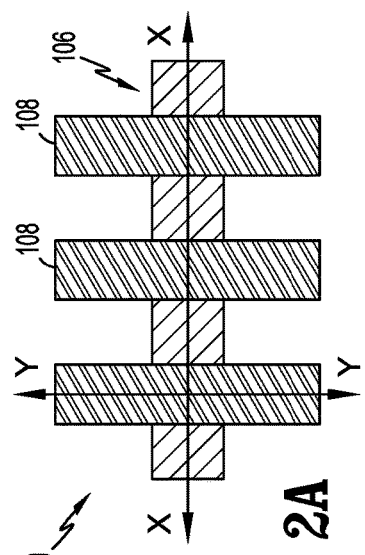
FIG. 2A is a schematic plan view in plan of a semiconductor structure including one or more nanosheet structures and gates to be processed at a second intermediate stage of fabrication according to one or more illustrative embodiments.
Figure 2C:
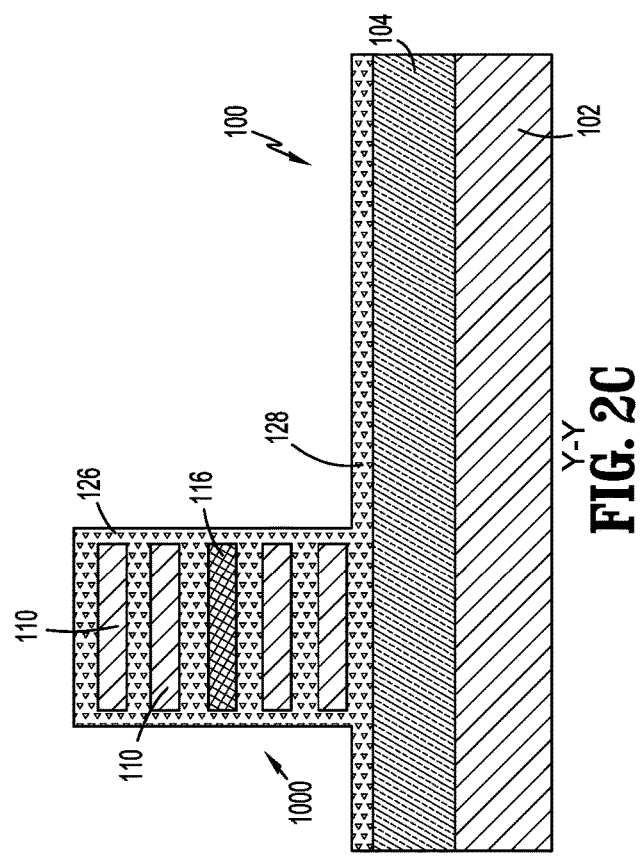
FIG. 2C is a cross-sectional view of the semiconductor structure taken along the lines y-y of FIG. 2A at the second intermediate stage of fabrication illustrating formation of a first gate extension according to one or more illustrative embodiments.
Figure 2B:
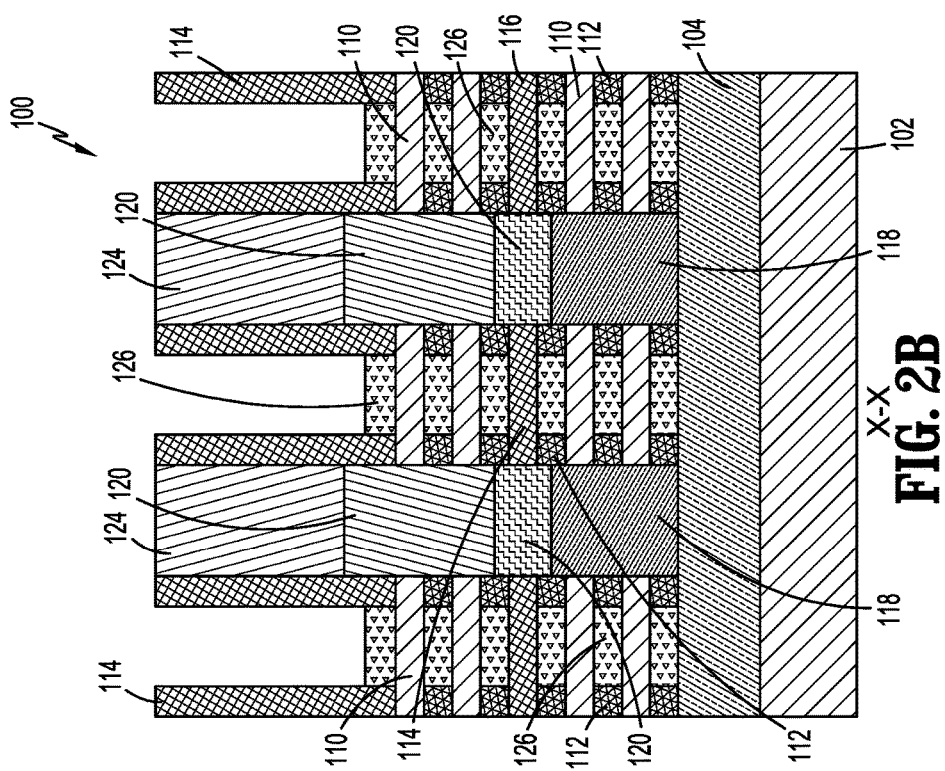
FIG. 2B is a cross-sectional view of the semiconductor structure taken along the lines x-x of FIG. 2A at the second intermediate stage of fabrication, illustrating deposition of a high-K and first work function metal about the CFET structures and formation of a first gate extension.

Referring now to FIGS. 2A-2C, representing a second intermediate stage of fabrication of semiconductor structure 100, a first high-k/work function metal gate material 126 is deposited on the semiconductor structure 100 around each of the channel layers 110 of the nanosheet stack 106 within the voids left by removal of the sacrificial gates 108 and between the suspended channel layers 110. In one exemplative embodiment, a high-k dielectric material can be deposited to form the gate dielectric. The gate dielectric may comprise a semiconductor oxide, semiconductor nitride, semiconductor oxynitride, or a high-k material having a dielectric constant greater than silicon oxide. A metal liner, e.g., a work-function metal, and a gate metal can then be deposited on the dielectric material filling the void to complete the high-k/metal gate structure.

In one or more embodiments, the metal liner can be, for example, TiN, TiC, TiAl, TiAlC, or TaN, and the gate metal or conductor may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. The material forming the metal gate may be subjected to one or more removal or planarization processes to be coplanar with the gate spacer 114.

As best depicted in FIGS. 2B and 2C, the deposition of the first high-k/work function metal gate material 126 forms a first gate extension 128 along the y-axis which extends beyond the lower FET device or structure 1000 in contact with the semiconductor substrate 102/oxide layer 104. The first gate extension 128 is filled on the shallow trench isolation area STI area within the semiconductor substrate 102 or between adjacent FET structures. The first gate extension 128 serves as a landing for a contact.

Figure 3A:
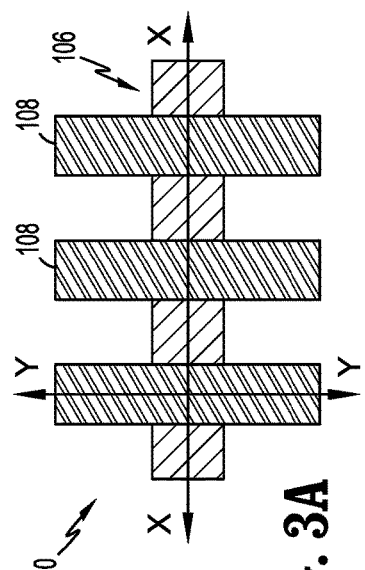
FIG. 3A is a schematic plan view in plan of a semiconductor structure including one or more nanosheet structures and gates to be processed at a third intermediate stage of fabrication according to one or more illustrative embodiments.
Figure 3C:
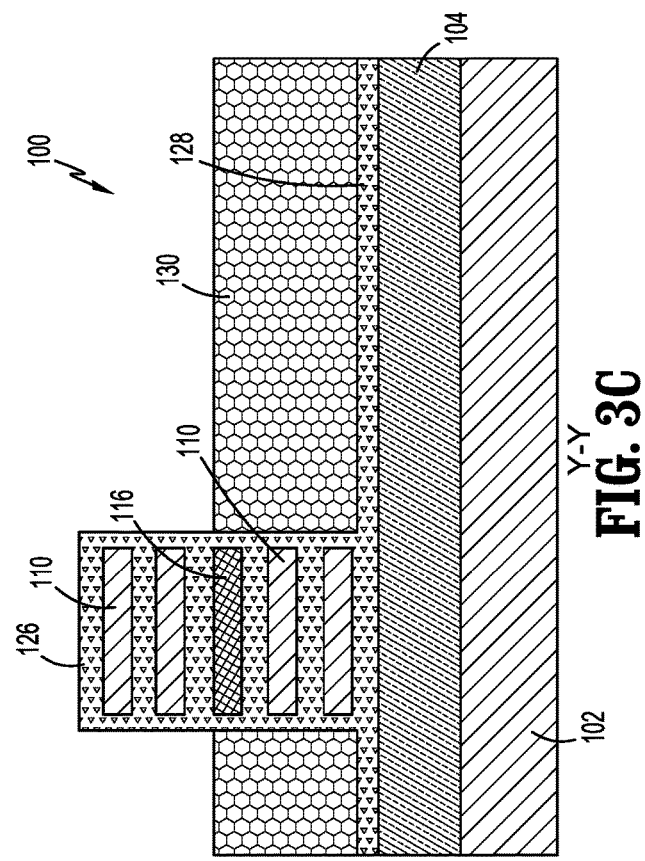
FIG. 3C is a cross-sectional view of the semiconductor structure taken along the lines y-y of FIG. 3A at the third intermediate stage of fabrication illustrating deposition of a dielectric layer on the first gate extension of the first gate.
Figure 3B:
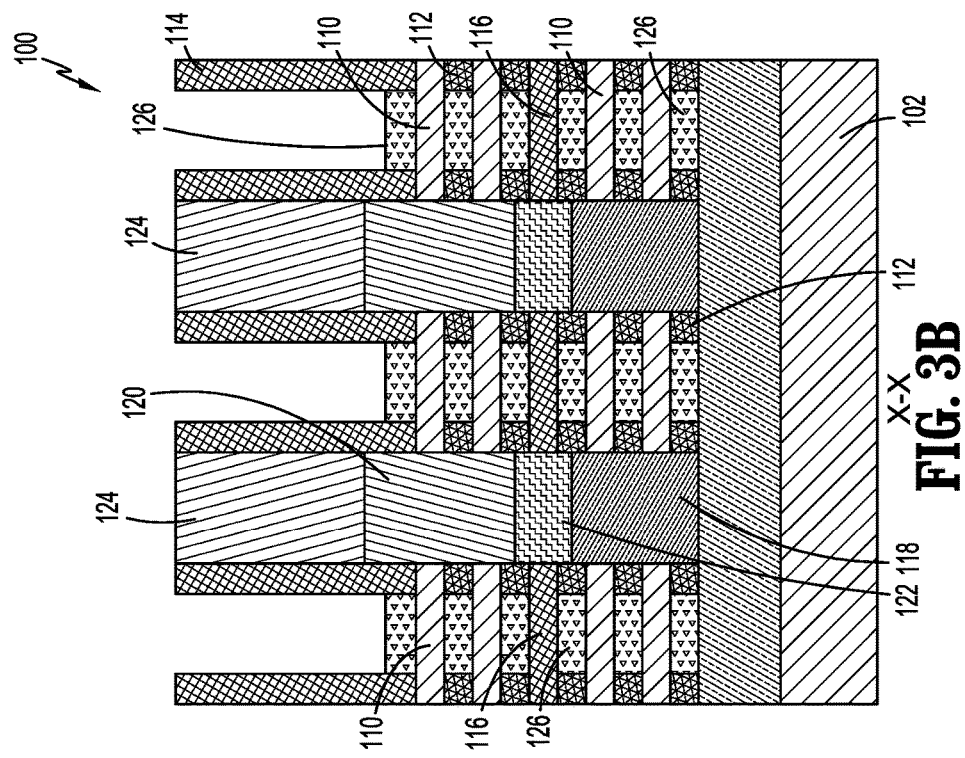
FIG. 3B is a cross-sectional view of the semiconductor structure taken along the lines x-x of FIG. 3A at the third intermediate stage of fabrication according to one or more illustrative embodiments.

Referring now to FIGS. 3A-3C, a third intermediate stage of fabrication of the semiconductor structure 100 is illustrated. A dielectric material is deposited onto the semiconductor structure 100 to form a dielectric layer 130. The dielectric material may be subjected to one or more planarization or polishing procedures such that the dielectric layer 130 extends from the first gate extension 128 to the isolation spacer layer 116. Suitable dielectric materials for forming the dielectric layer 130 include but are not limited to, silicon oxide, silicon nitride, silicon oxynitride, SiCO, SiCON, or any suitable combination of such materials.

Figure 5:
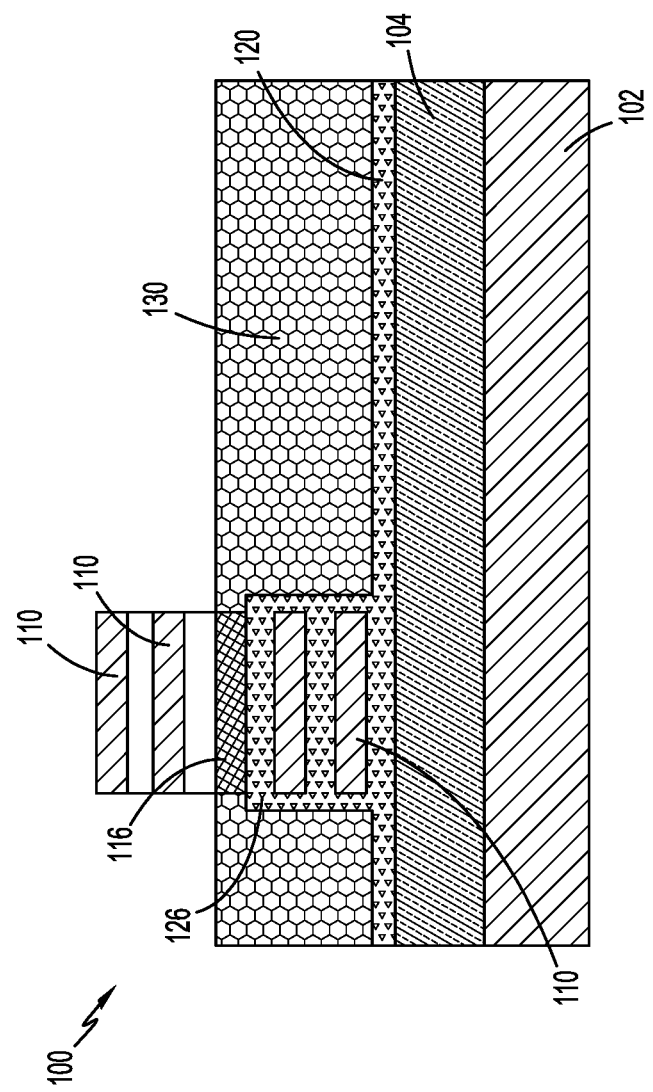
FIG. 5 is a cross-sectional view taken of the semiconductor structure similar to the view of FIG. 4C at a fifth intermediate stage of fabrication illustrating selective deposition of a dielectric material to fill the gaps around the lower FET structure according to one of more illustrative embodiments.

Referring now to FIGS. 4A-4C, the first high-k/work function metal gate material 126 is removed from the upper nanosheet stack to expose the isolation spacer layer 116. Any suitable removal or etching process may be utilized. Upon removal of the first high-k/work function metal gate material 126, a space or divot 132 is formed between the dielectric layer 130 and the isolation spacer layer 116 on opposed sides of the isolation spacer layer 116. Thereafter, as depicted in FIG. 5, the divots 132 are filled, via one or more suitable deposition processes, with a dielectric material to overlap the exposed bottom gate. The material utilized to fill the divots 132 may be the same material as the dielectric layer 130.

Figures 6A, 6B:
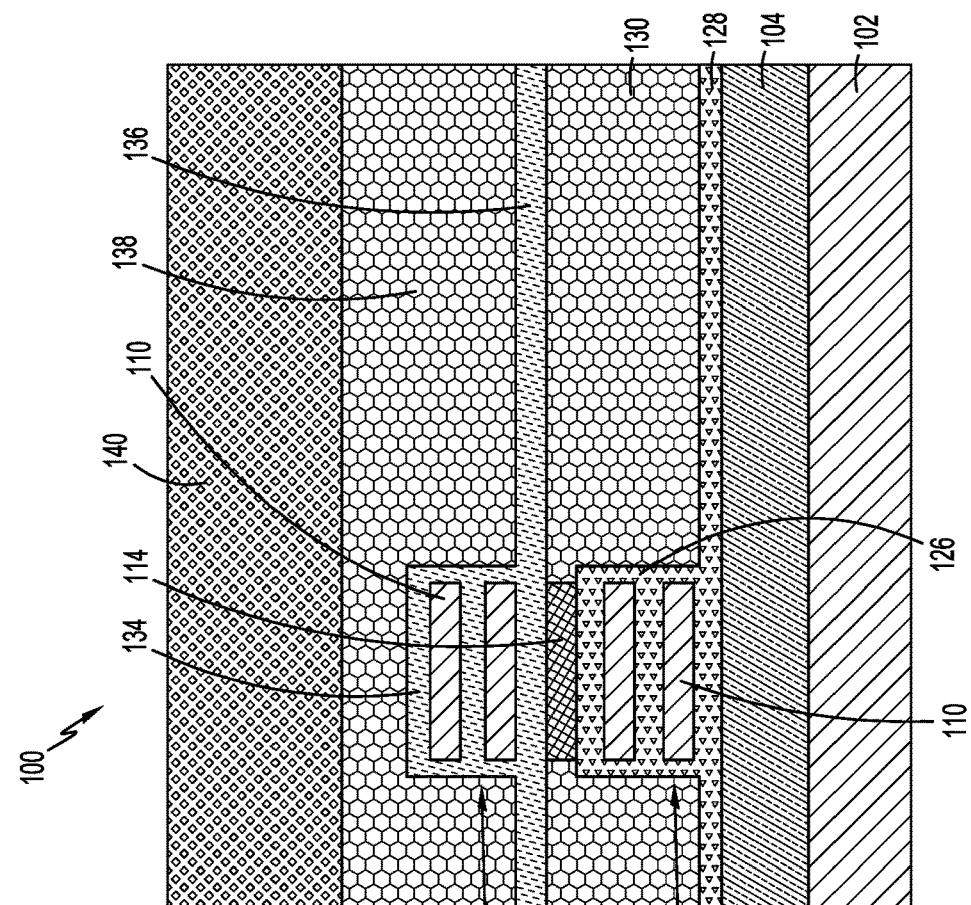
FIG. 6A is a cross-sectional view of the semiconductor structure taken along the x-x axis at a sixth intermediate stage of fabrication illustrating deposition of a high k and second work function metal in the upper FET structure, deposition of a dielectric fill layer and a SAC cap layer onto the semiconductor structure.
FIG. 6B is a cross-sectional view of the semiconductor structure taken along the y-y axis at the sixth intermediate stage of fabrication further illustrating formation of a second gate extension according to one or more illustrative embodiments.

With reference to FIGS. 6A and 6B, in a sixth stage of fabrication, a second high-k/work function metal gate material 134 is deposited onto the semiconductor structure to from an all-around gate about the upper FET structure 2000. The second high-k/work function metal gate material 134 may or may not be the same material as the first high-k/work function metal gate material 126. As a result of this process, a second gate extension 136 extends from the second high-k/work function metal gate material 134 along the y-axis. A dielectric material is then deposited onto the second high-k/work function metal gate material 134 to form dielectric layer 138. The dielectric layer 138 may comprise the same materials as the first dielectric layer 130 and may be deposited via conventional deposition techniques. The dielectric layer 138 may be subjected to a polishing or process. In addition, a cap layer 140 may be deposited on the second dielectric layer 138. The cap layer 140 may be formed of one or more of $Si_3N_4$, SiBCN, SiNC, SiN, SiCO, $SiO_2$ and SiNOC. The cap layer 140 can be formed of the same material or different material from that of gate spacers 114. As shown in FIGS. 6A and 6B, the isolation spacer layer 116 separates the lower and upper FET structures 1000, 2000.

Figure 7:
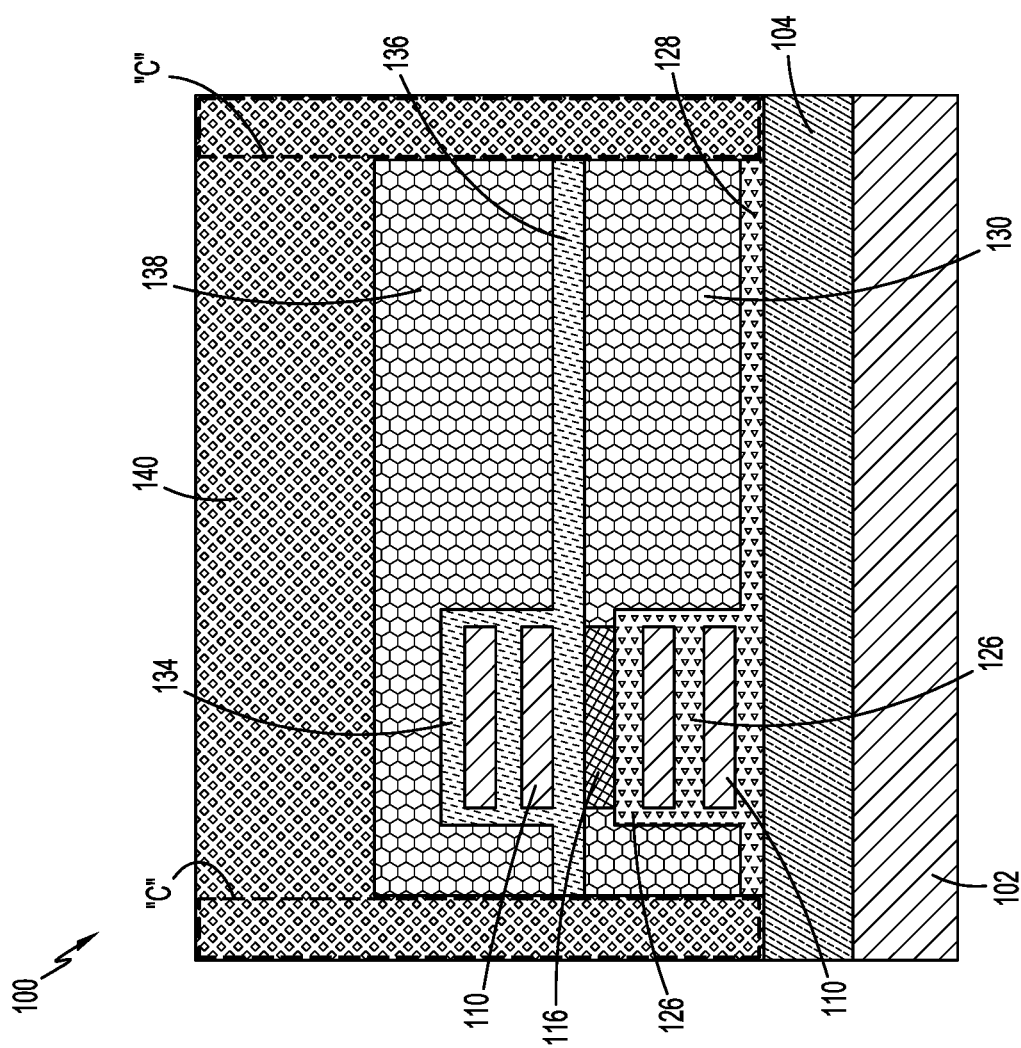
FIG. 7 is a cross-sectional view of the semiconductor structure taken along the x-x axis at a seventh intermediate stage of fabrication illustrating gate cut formation on the semiconductor structure.
Figure 8:
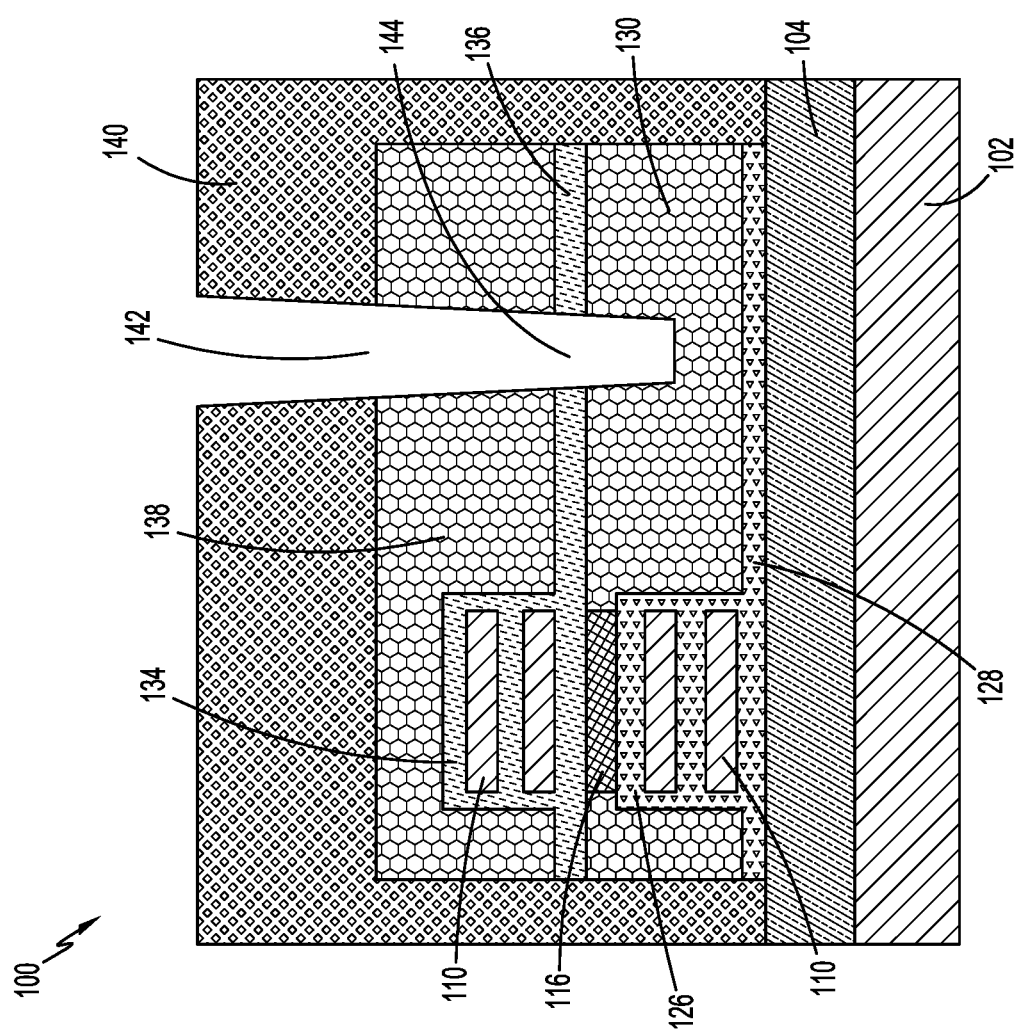
FIG. 8 is a cross-sectional view of the semiconductor structure taken along the x-x-axis at an eighth intermediate stage of fabrication illustrating formation of a partial via through the dielectric layer and the second gate extension of the second gate according to one or more illustrative embodiments.
Figure 9:
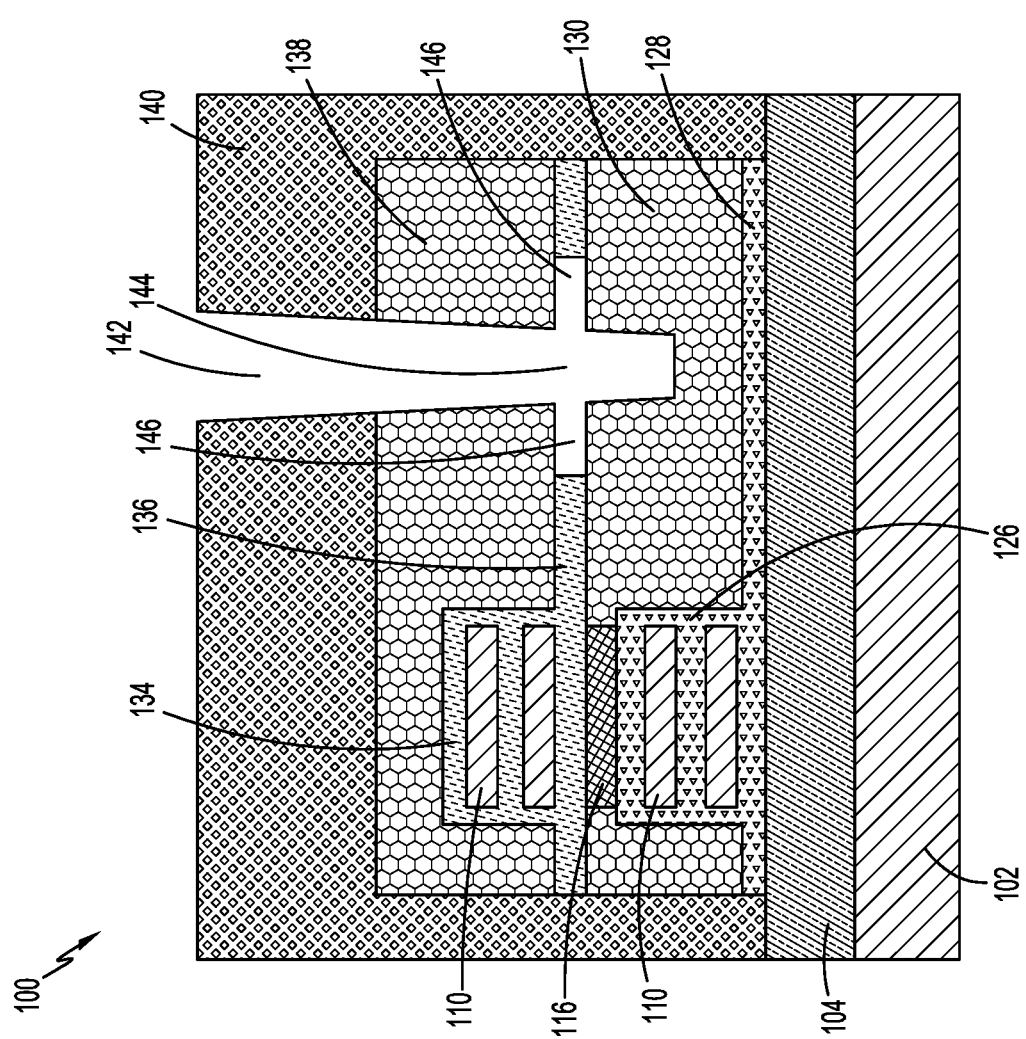
FIG. 9 is a cross-sectional view of the semiconductor structure taken along the x-x axis at a ninth intermediate stage of fabrication illustrating formation of a recess surrounding the via opening in the second gate extension of the second gate according to one or more illustrative embodiments.
Figure 10:
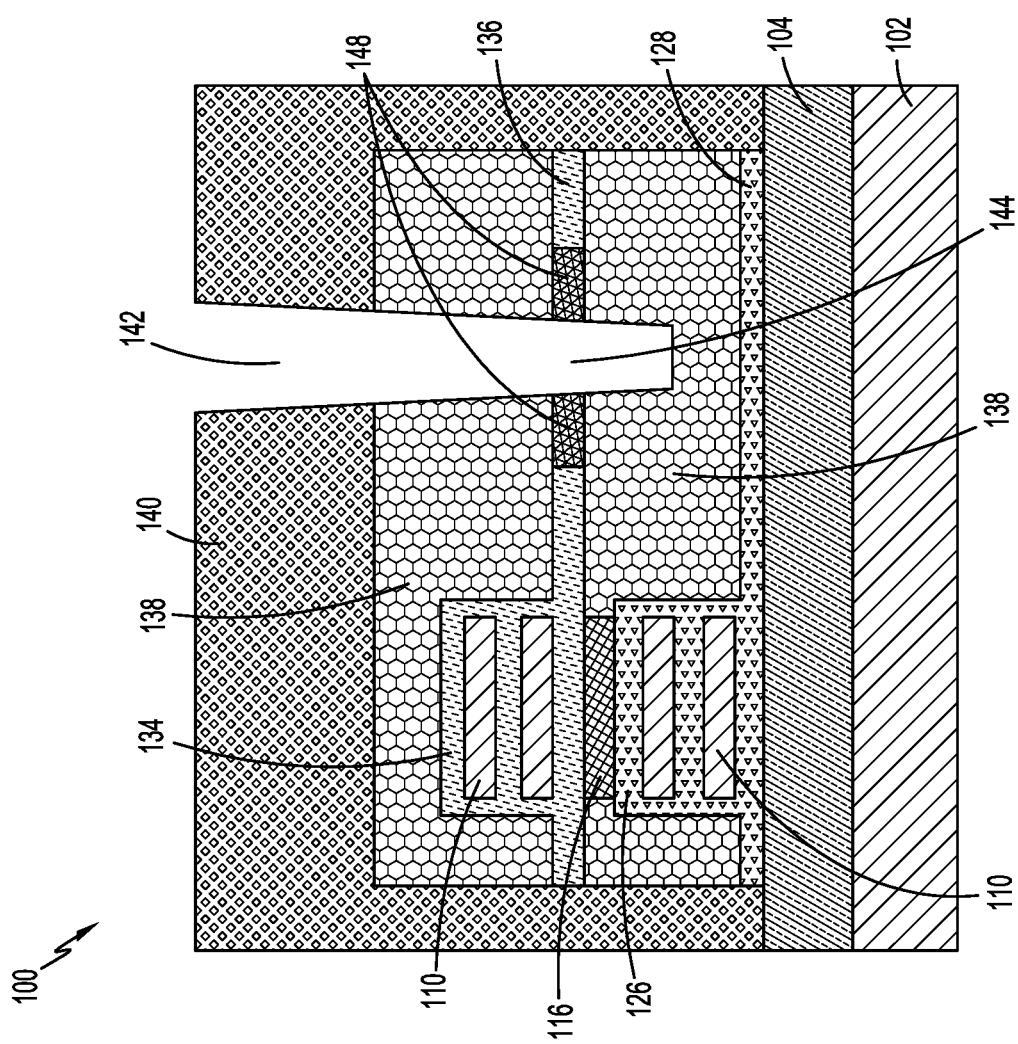
FIG. 10 is a cross-sectional view of the semiconductor structure taken along the x-x axis at a tenth intermediate stage of fabrication illustrating formation of an inner insulative spacer within the recess surrounding the via opening in the second gate extension according to one or more illustrative embodiments.

Referring now to FIG. 7, a gate cut process (shown schematically by lines "c") is performed on the semiconductor structure 100 to form multiple gate assemblies. As shown in FIG. 8, through one or more lithographic and removal process including, for example, a reactive ion etching (RIE) process, a trench 142 is formed through the cap layer 140, the dielectric layer 138 and the second gate extension 136 of the second high-k/work function metal gate material 134 and at least partially into the dielectric layer 130 beneath the second gate extension 136. The trench 142 defines an opening 144 in the second gate extension 136. Thereafter, as depicted in FIG. 9, an isotropic removal process is utilized to indent or define one or more recesses 146 within the second metal gate material surrounding the opening 144 in the second gate extension 136. A dielectric material is thereafter deposited within the recesses 146 through one or more suitable directional deposition processes to form an insulator inner spacer 148 within the second gate extension 136 surrounding the opening 144 as depicted in FIG. 10. Any suitable dielectric insulative material may be utilized for insulator inner spacer 148.

Figure 11:
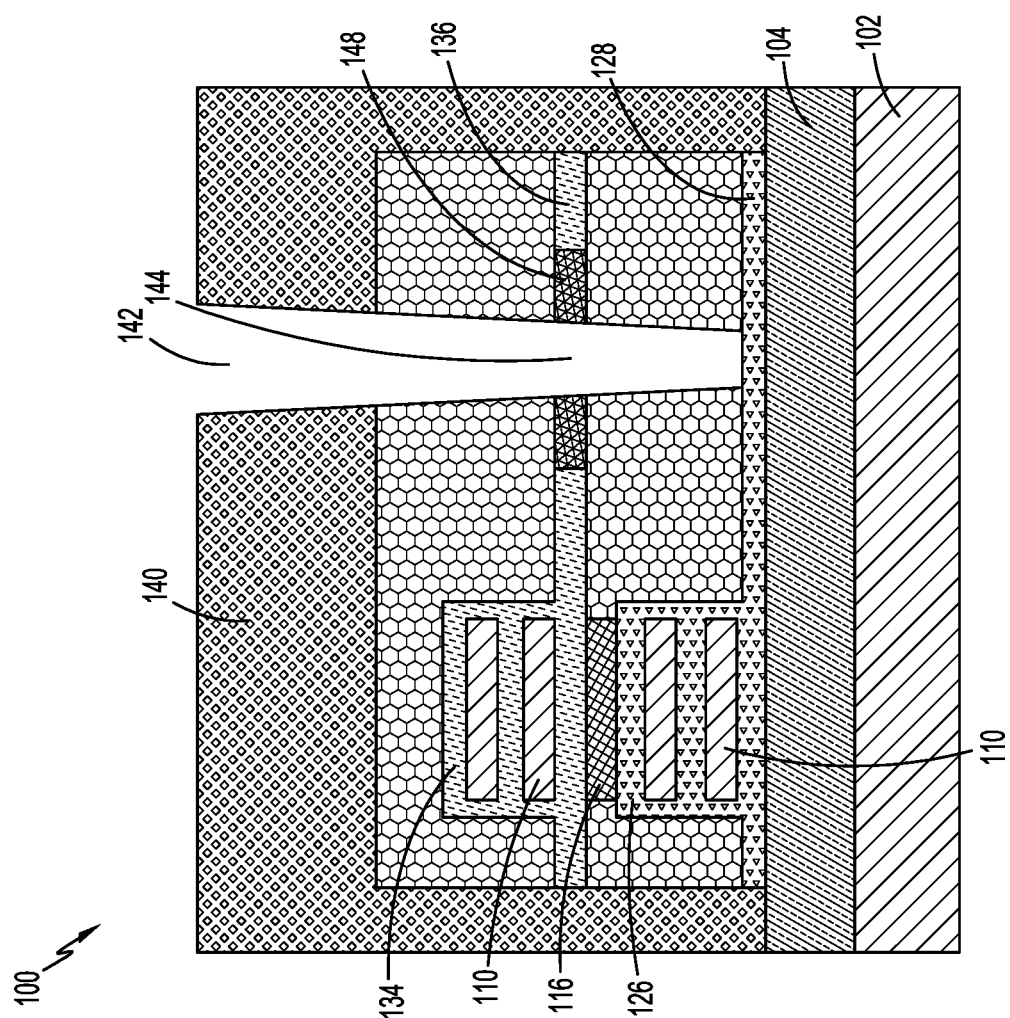
FIG. 11 is a cross-sectional view of the semiconductor structure along the x-x axis at an eleventh intermediate stage of fabrication illustrating the via extension extended to the first gate extension of the first gate according to one or more illustrative embodiments.
Figure 12:
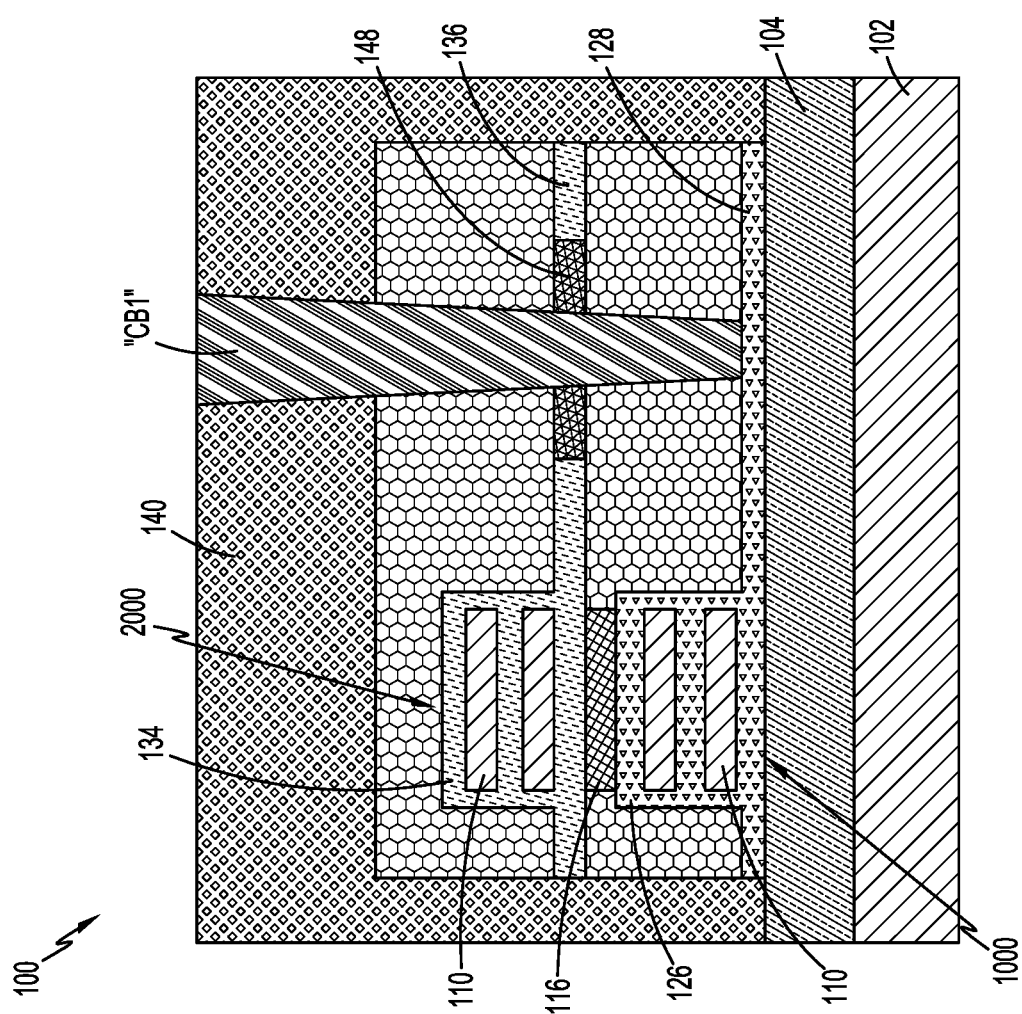
FIG. 12 is a cross-sectional view of the semiconductor structure taken along the x-x axis at a twelfth intermediate stage of fabrication illustrating formation of a via contact in the via opening to the first gate extension of the first gate according to one or more illustrative embodiments.

Referring now to FIG. 11, through at least one additional removal process including, for example, another reactive ion etching (RIE) process, the trench forming process is continued to extend the trench 142 to be coterminous with the first gate extension 128 of the first high-k/work function metal gate material 126. Thereafter, using, known metallization processes, a metal is deposited into the trench 142 to form first gate contact "CB1" electrically coupled with the first gate extension 128 and thus the first high-k/work function metal gate material 126 of the lower FET device 1000 as depicted in FIG. 12. The first gate contact CB1 is electrically isolated from the second gate extension 136 through the provision of the opening 144 in the second gate extension 136 and the insulator inner spacer 148.

Figure 13:
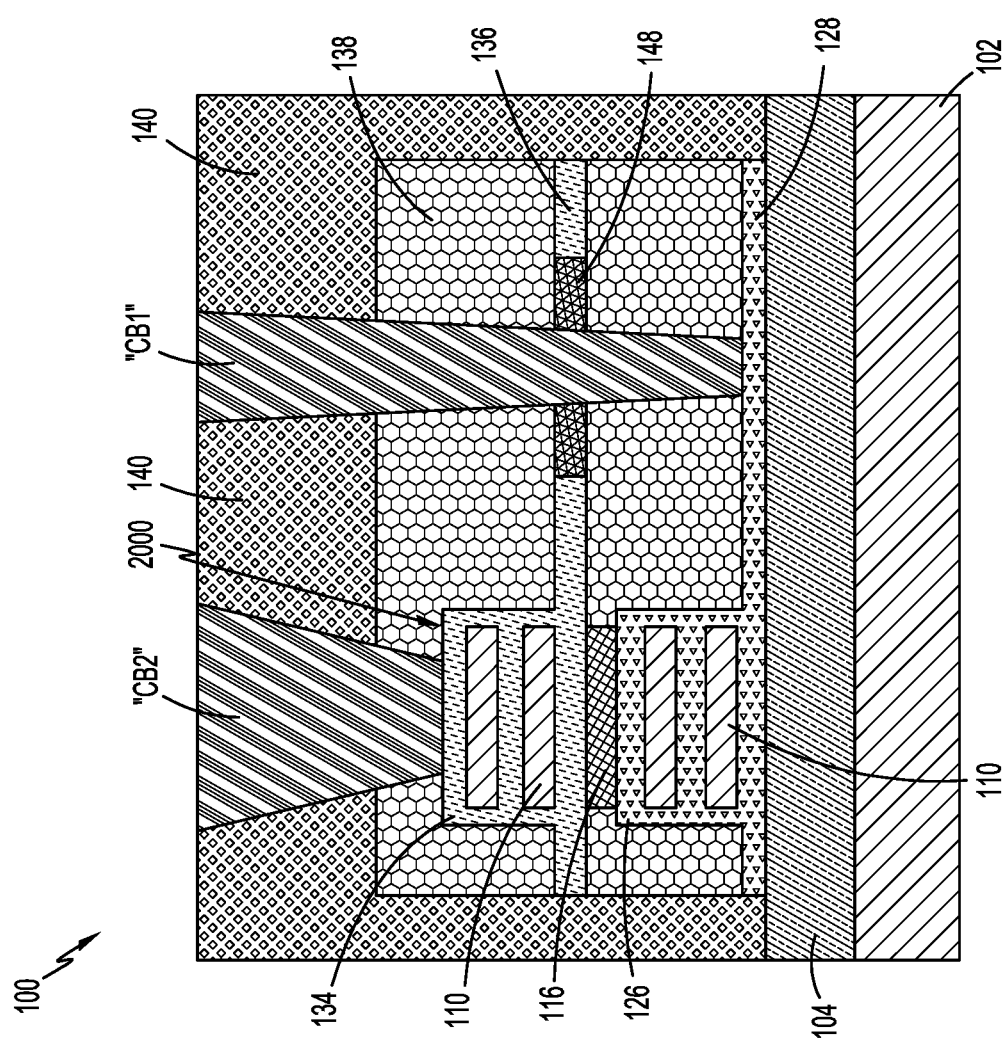
FIG. 13 is a cross-sectional view taken of the semiconductor structure taken along the x-x axis at a thirteenth intermediate stage of fabrication illustrating formation of a second via contact with the second gate of the CFET stack.

Referring now to FIG. 13, using known lithographic and metallization techniques, a second via or trench is formed through the cap layer 140 and the dielectric layer 138 in alignment with the second high-k/work function metal gate material 134. A metallization process is utilized to form a second contact "CB2" in electrical contact with the second high-k/work function metal gate material 134 and the upper FET structure 2000.

Thus, the present disclosure provides a CFET device having lower and upper FET devices or structures 1000, 2000 with respective gate extensions 128, 136 which enable the provision of gate contacts CB1, CB2 electrically isolated from the each other. Moreover, the lower and upper FET structures 1000, 2000 are isolated via isolation spacer layer 116. The first or lower FET structure 1000 includes a plurality of first channel layers 110 (e.g., two first channel layers) while the upper or second FET structure 2000 includes a plurality of second channel layers 110 (e.g., two second channel layers). In illustrative embodiments, the lower FET structure 1000 is a pFET structure and the upper FET structure 2000 is an nFET structure. The opposite orientation is also envisioned.

Advantageously, illustrative embodiments provide structures and methods for forming separate, and thus electrically isolated, nFET and pFET gate contacts in a CFET device.

In some embodiments, the above-described techniques are used in connection with manufacture of nanosheet transistor structures for semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first nanosheet device, the first nanosheet device including at least one first channel layer and a first gate, the first channel layer extending a first length;
a second nanosheet device disposed above the first nanosheet device, the second nanosheet device including at least one second channel layer and a second gate, the second channel layer extending the first length;
an isolation layer disposed between the first nanosheet device and the second nanosheet device to electrically isolate the first nanosheet device and the second nanosheet device the isolation layer extending the first length;
a first gate contact coupled to the first gate; and
the first gate includes a first gate extension extending beyond the at least one first channel layer, the first gate contact coupled to the first gate extension.

2. The semiconductor structure of claim 1 including a second gate contact coupled to the second gate.

3. The semiconductor structure of claim 2 wherein the second gate includes a second gate extension extending beyond the at least one second channel layer and disposed above the first gate extension of the first gate.

4. The semiconductor structure of claim 3 wherein the second gate extension defines an opening for passage of the first gate contact whereby the first gate contact is electrically isolated from the second gate extension.

5. The semiconductor structure of claim 4 including a dielectric inner spacer at least partially circumscribing the opening in the second gate extension.

6. The semiconductor structure of claim 1 wherein the first nanosheet device is one of an nFET device and a pFET device and the second nanosheet device is the other of the nFET device and the pFET device.

7. An integrated circuit comprising:
a first FET structure including a first gate having a first gate extension, at least one first source, at least one first drain and a first channel layer extending a first length;
a second FET structure disposed above the first FET structure, the second FET structure including a second gate and a second channel layer extending the first length;
a first gate contact coupled to the first gate extension of the first gate; and
a second gate contact coupled to the second gate and isolated from the first gate by an isolation layer extending the first length.

8. The integrated circuit of claim 7 wherein the second gate contact includes a second gate extension.

9. The integrated circuit of claim 8 wherein the second gate extension of the second gate is disposed above the first gate extension of the first gate, the second gate extension defining an opening for the first gate contact, the first gate contact electrically isolated from the first gate contact.

10. The integrated circuit of claim 9 including a dielectric inner spacer at least partially circumscribing the opening in the second gate extension.

11. The integrated circuit of claim 7 wherein the first FET structure includes a first plurality of channel layers extending the first length and the second FET structure includes a second plurality of channel layers extending the first length.

12. The integrated circuit of claim 7 wherein the first FET structure is one of an nFET device and a pFET device and the second FET structure is the other of the nFET device and the pFET device.

13. A semiconductor device comprising:
a first nanosheet device, the first nanosheet device including at least one first channel layer and a first gate, the first channel layer extending a first length;
a second nanosheet device disposed above the first nanosheet device, the second nanosheet device including at least one second channel layer and a second gate, the second channel layer extending the first length;
an isolation layer disposed between the first nanosheet device and the second nanosheet device to electrically isolate the first nanosheet device and the second nanosheet device, the isolation layer extending the first length; and
a first gate contact coupled to the first gate, wherein the first gate includes a first gate extension extending beyond the at least one first channel layer, the first gate contact coupled to the first gate extension.

14. The semiconductor device of claim 13, further comprising a second gate contact coupled to the second gate.

15. The semiconductor device of claim 14, wherein the second gate includes a second gate extension extending beyond the at least one second channel layer and disposed above the first gate extension of the first gate.

* * * * *